May 28, 1963 W. M. MURPHY, JR 3,091,740

AUTOMATIC TRACKING CIRCUIT

Filed June 17, 1957 2 Sheets-Sheet 1

INVENTOR
WILLIAM M. MURPHY, JR.
BY Elmer J. Gorn
ATTORNEY

INVENTOR
WILLIAM M. MURPHY, JR.
Joseph D. Pannone
ATTORNEY 3,091,740
Patented May 28, 1963

3,091,740

AUTOMATIC TRACKING CIRCUIT

William M. Murphy, Jr., Wellesley Hills, Mass., assignor to Raytheon Company, a corporation of Delaware Filed June 17, 1957, Ser. No. 667,305
9 Claims. (Cl. 331—4)

Figure 1:
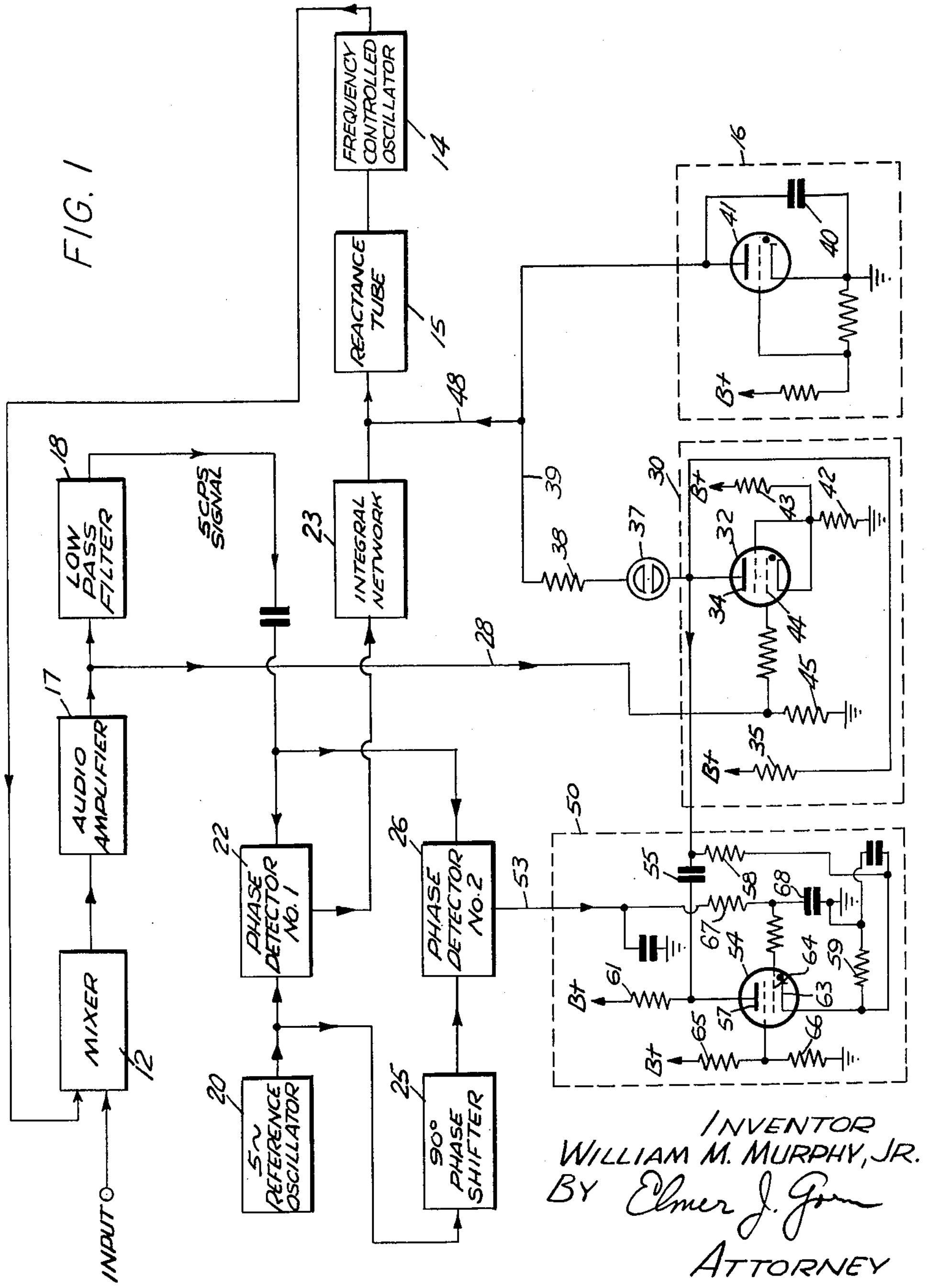

This invention concerns an improved speed gate adapted for searching for a coherent input signal, such as a Doppler signal, within a predetermined band width and for locking on this signal in frequency.

In general, the system of the invention includes a spectrum analyzer containing a sweep generator for scanning repetitively a band of frequencies. The incoming signal and the output of a reactance tube controlled oscillator are combined to produce a beat frequency signal. This beat frequency signal is amplified in an audio amplifier having a band width of the order of 500 cycles per second and then filtered in a low pass filter with a very narrow bandpass so as to provide a good response to signals wherein the signal-to-noise ratio is poor; the bandpass of this low-pass filter may, for example, be of the order of 10 cycles per second. The beat frequency signal after passage through the low-pass filter, is maintained at a very low audio frequency, for example, 5 cycles per second, by means of a feedback loop including a phase detector for comparing the phase of the beat frequency signal and the phase of a low frequency synchronizing source or reference oscillator, whose frequency is equal to that of the desired beat frequency signal when the error signal is a minimum. As the incoming Doppler signal is swept through the 500-cycle per second audio band width of the audio amplifier, the positive going amplitude of the decreasing beat frequency signal is used to trigger a locking circuit to cause cessation of the scanning sweep and to permit the system to synchronize, i.e., to lock in frequency to the incoming signal. It should be noted that the value of 500 cycles per second given for the audio amplifier is illustrative only and the bandwidth of the audio amplifier may differ from 500 cycles per second. This band width, however, must be sufficiently great to insure a reasonably flat response essential for triggering the sweep disabling means. The lock signal stops the sweep long enough for the signal to build up in the low-pass filter band width, whereupon the tracking loop will synchronize causing a lock on the incoming signal. After passing through the low-pass filter, the beat frequency signal, if any, is compared in phase in a second phase detector with the output of the reference oscillator shifted 90 degrees in phase, whereupon a negative recycle voltage is supplied to a recycle circuit to prevent the sweep generator from resuming sweep during reception of the incoming signal. In the absence of an input signal, the recycle circuit operates upon the locking circuit after a predetermined time interval (approximately 0.1 second) in such a manner that the sweep generator may resume sweeping.

Because of the narrow band width of the low-pass filter, and the fact that the second phase comparator provides an output only during the presence of a coherent signal, the effect of random noise on the operation of the locking circuit is substantially nullified and the system is prevented from locking on noise energy. However, sufficient noise is present in the output of the 500-cycle audio amplifier to increase the amplitude of the locking signal to the point where positive operation of the locking circuit is insured.

Figures 2A, 2B, 2C:
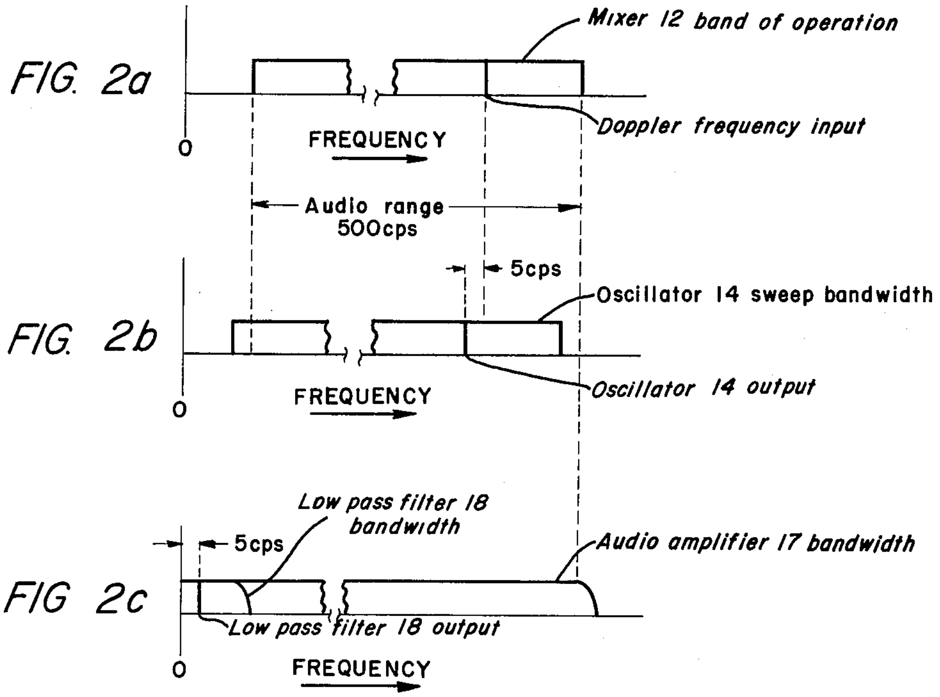

Further advantages and features of the invention will become apparent from the detailed description of an embodiment thereof and the drawings. FIG. 1 illustrates a circuit diagram of an embodiment of the invention, and FIGS. 2A, 2B and 2C illustrate operating frequency bands and outputs of various of the components in the circuit.

Referring to FIG. 1, a frequency-controlled oscillator 14 is adapted to be varied cyclically by a sawtooth sweep generator 16 connected in circuit with a reactance tube 15; the frequency of the oscillator 14 is determined by the parameters of the reactance tube 15. A fixed frequency input signal, such as a Doppler signal, is applied to a mixer circuit 12, together with the output from oscillator 14. A beat frequency signal of very low frequency is derived from mixer 12, and, for reasons which will be more evident later, this particular frequency signal is of the order of 5 cycles per second; it should be understood, of course, that the invention is not restricted to systems with a beat frequency of this value. The beat frequency signal is supplied to an audio amplifier 17 whose passband is from zero to about 500 cycles per second. A band width of this order of magnitude is required to insure a sufficiently fast response essential to triggering the sweep disabling means. The output of this amplifier contains a small amount of noise in addition to the beat frequency, if any, from mixer circuit 12. The output of amplifier 17 is fed to a low-pass filter 18 having a bandpass of approximately twice the order of magnitude of the beat frequency signal. (This band width ratio is the minimum felt desirable from a transient response point of view, because of the rapid increase in phase slope as this ratio decreases.) The narrower the band width of the low-pass filter, the better the response of the system is to signals with poor signal-to-noise ratio. This requirement makes is desirable that the beat frequency be as close to zero as possible. The passband of filter 18 is sufficiently small that no appreciable noise components are present in its output. The audio amplifier 17 and low-pass filter 18 inherently permit rejection of undesired beat frequency components. The beat frequency signal from the low-pass filter 18 and a reference signal from a fixed frequency or reference oscillator 20 are supplied to a first phase detector or comparator 22. Reference oscillator 20 produces an output whose frequency is equal to the desired beat frequency. A direct current error voltage is derived from the output of phase detector 22 which is dependent upon the relative phase of the two input signals to phase detector 22. Phase detector 22 is of the well-known type wherein a minimum error voltage is obtained when the phase displacement of the two input signals is 90 degrees. The error voltage thus obtained from phase detector 22 is applied through an integral network 23 to the frequency-controlling portion of controlled oscillator 14. This frequency-controlling means may be a reactance tube 15; however, it should be understood that the invention is not limited to any particular type of oscillator or to any particular means for controlling the frequency thereof. For example, if the controlled oscillator 14 were a klystron oscillator, frequency control may be effected by adjustment of repeller voltage. The purpose of the integral network 23 is to obtain a proper stability margin, that is, to close the oscillator feedback control loop so that the desired transient response will be obtained.

The output of audio amplifier 17, during the presence of an input signal, consists of an A.C. signal only which is supplied directly to the input circuit of a locking circuit 30 by way of line 28; the details of locking circuit 30 will be described later.

The output of reference oscillator 20 is shifted 90 degrees in phase by phase shifter 25 and supplied to a phase detector 26 similar in construction to phase detector 22. The beat frequency signal from low-pass filter 18 also is fed to phase detector 26 so that when the output of amplifier 17 is positive-going and a negative-going output voltage is obtained from detector 26 because of the 180-degree relationship of the two inputs thereto. This negative voltage, present only during reception of a coherent input signal, is supplied to the grid of a recycle circuit 50.

FIGURES 2A, 2B and 2C illustrate the frequency band pass of mixer 12, oscillator 14, audio amplifier 17 and low-pass filter 18. They also illustrate the range of frequencies that oscillator 14 sweeps through by virtue of the sweep control signal from saw tooth sweep generator 16. FIG. 2A illustrates the band of operation of mixer 12 which covers all expected input Doppler frequencies. One Doppler frequency input is shown for purposes of example. FIG. 2B illustrates the frequency band sweep by oscillator 14 in response to the saw tooth waves from generator 16. It will be noted that this band width is the same width as the band of operation of mixer 12 shown in FIG. 2A but is displaced an amount equal to the frequency output of the reference oscillator 20. For purposes of example the output frequency of oscillator 14 corresponding to the Doppler frequency input shown in FIG. 2A is illustrated. This oscillator output shown in FIG. 2B, is of course, the frequency output of the oscillator when the system is stabilized and the saw tooth waves from generator 16 have ceased. It will be noted that the oscillator output shown in FIG. 2B and the Doppler frequency input shown in FIG. 2A are displaced from each other an amount equal to the reference frequency from oscillator 20.

FIG. 2C illustrates the preferred bandwidth of audio amplifier 17 and preferred bandwidth of low-pass filter 18 as well as an output frequency from filter 18 corresponding to the Doppler frequency input and oscillator output shown in FIGS. 2A and 2B, respectively. It will be noted that the frequency output of filter 18 such as shown in FIG. 2C is equal to the frequency of reference oscillator 20. Obviously, when this occurs the output of phase detector 22 will be a steady signal which will serve to hold the frequency output of oscillator 14 steady at the value indicated in FIG. 2B.

Locking circuit 30 comprises a thyratron tube 32 whose anode 34 is supplied with a voltage of, for example, 300 volts, by way of an anode resistor 35. Tube 32 has a potential at the anode 34 of about 300 volts in the cut-off condition, while the control grid 44 is at about ground, the cut-off condition being established by the voltage divider resistors 42 and 43 connected between the positive terminal of a 300-volt source and ground, to thereby provide a positive voltage on the cathode and a correspondingly less positive bias (ground) on grid 44. Thus, locking thyratron tube 32 normally is held non-conductive by the fixed positive cathode voltage produced by resistors 42 and 43. The charging current for the sweep generator capacitor 40 is then provided by way of resistor 35, neon gas tube 37, resistor 38 of the order of 2 megohms and line 39. The gaseous tube 37 serves to isolate capacitor 40 when the locking thyratron 32 is fired so that capacitor 40 remains charged to the extent that it was charged at the instant of such firing.

The locking circuit 30 is responsible for control of the sweeping of sweep generator circuit 16. A control signal for locking tube 32 is supplied to the control grid 44 thereof by way of line 28 from audio amplifier 17, and this signal appears across resistor 45 as a cyclic voltage relative to ground. A signal of sufficient magnitude in the positive direction with respect to ground will fire the locking thyratron tube 32, thus reducing the potential of anode 34 nearly to ground potential. The gas tube 37 may be a neon tube having an ignition voltage of about 85 volts and an extinction voltage of approximately 55 volts. When the system is first turned on, the required ignition voltage is provided by the source connected to resistor 35; tube 37 fires and provides a path to the charging capacitor 40. The latter is charged to a voltage of from 20 to 50 volts in normal operation and is always discharged at the same level, that is, about 50 volts. When the locking thyratron tube 32 is fired, the potential of anode 34 assumes a value of the order of 20 volts and, consequently, the voltage across neon tube 37 is such as to extinguish the tube. Thereafter, the capacitor 40 is isolated completely from any possible discharge path and retains the charge built up on capacitor 40 at the time of firing of tube 32. The receiver is caused to resume sweeping through the established frequency range by cutting off the locking thyratron 32, which thus allows neon tube 37 to refire.

The sweep voltage generator 16 provides a sawtooth voltage wave by charging capacitor 40 in a relaxation oscillator circuit including gaseous discharge device 41, such as a thyratron, in a well-known manner. The sweep generator 16 controls the reactance tube circuit 15 by applying the voltage across charging capacitor 40 to the reactance tube circuit over line 48.

If a true signal is present at the time the locking circuit 30 causes a cessation of sweep, then a undirectional signal of the proper sense from phase detector 26 will appear on line 53 and will be applied to recycle circuit 50.

Recycle circuit 50 includes a gaseous discharge tube 54, such as a thyratron, which is designed so that normally tube 54 becomes conductive within a predetermined interval after the thyratron tube 32 of locking circuit 30 has become conductive. When tube 54 conducts, the locking tube 32 is cut off and the sweep generator 16 resumes sweeping. However, if a suitable signal is present on line 53, that is, when the receiver has become locked on a true signal, rather than random noise, the recycle circuit 50 is prevented from cutting off tube 32. This operation will now be explained in greater detail.

When the sweep generator 16 is sweeping, a bias is applied to cathode 63 of recycle tube 54 from the plate 34 of the locking tube 32; this bias keeps the recycle tube de-ionized. The cathode 63 of recycle tube 54 prior to firing of locking tube 32 is maintained at a potential of about +2.9 volts relative to ground by the resistive network consisting of resistors 58 and 59 connected in series with the anode 34 of locking thyratron tube 32 and ground. Thus the control grid 64 of the recycle tube 54 is effectively at a bias of −2.9 volts. The recycle tube 54 requires an anode voltage of about 300 volts at this grid bias of 2.9 volts in order to fire. When locking tube 32 is fired, the potential at the anode 34 thereof drops to a potential of about +20 volts relative to ground and the plate voltage at plate 57 of recycle tube 54 drops with it since coupling capacitor 55 acts as a momentary short circuit. The cathode bias of about −2.9 volts provided by resistors 58 and 59 then drops to about −0.2 volt. The shield grid voltage produced by voltage dividing resistors 65 and 66 connected to the positive 300-volt potential normally is about 2.2 volts positive. Thus, recycle tube 54 will fire at an anode voltage somewhat lower than 300 volts, viz., at about 165 volts, unless prevented from doing so by a negative-going signal from phase detector 26 biasing grid 64 back to a more negative bias than the −0.2 volt with respect to cathode before capacitor 55 charges to about 165 volts positive with respect to ground. A resistor 67 and capacitor 68 located in line 53 and forming a part of the recycle tube input circuit constitutes a low-pass filter.

When the locking thyratron 32 is in a cut-off condition, the coupling capacitor 55 interconnecting the anode 34 of locking thyratron tube 32 and the anode 57 of recycle tube 54 has a potential of about zero volts. The side of coupling capacitor 55 connected to recycle tube anode 57 instantaneously drops to a voltage of about −20 volts with respect to ground when locking thyratron 32 is fired. The coupling capacitor 55 at once begins to charge toward the positive supply voltage and current flows from the recycle tube anode voltage source through anode resistor 61, coupling capacitor 55, the conductive-locking tube 32, cathode resistor 42 and ground. The side of the coupling capacitor 55 connected to the recycle tube anode 57 is charged toward a potential of 300 volts positive, while the other side of this capacitor remains at a potential of about 20 volts positive, so that the final voltage across coupling capacitor 55 is about 280 volts. The time constant of the charging circuit is determined mainly by the parameters of the recycle tube anode resistor 61 (about 2.2 megohms) and the coupling capacitor 55 (about 0.05 microfarad); the time constant is approximately 0.11 second, which is the time for the side of coupling capacitor 55 connected to the recycle tube anode 57 to change potential 63 percent of the difference between 20 volts and 300 volts (280 volts). In approximately 0.11 second the anode 57 of recycle tube 54 will have arrived at a voltage of about 176 volts such that, if no holding bias were applied to its grid from phase detector 26 during this interval, recycle tube 54 will ionize.

Instantaneously, the recycle tube plate voltage falls, causing capacitor 55 to discharge through the locking tube plate resistor 35, dropping the lock tube plate potential so that locking tube 32 will de-ionize. The recycle tube 54 will then de-ionize as the plate current through resistor 61 will be insufficient to sustain ionization; this terminates the pause-locking interval.

If a holding voltage from phase detector 26 is developed during the pause-lock interval, the recycle tube 54 will be unable to ionize and thus the lock tube 32 remains fired and holds the speed gate locked.

What is claimed is:

1. A receiver of input signals comprising a frequency-controlled oscillator, frequency scanning means for varying the frequency of said oscillator within a prescribed range when in the frequency scanning condition, a fixed reference frequency generator productive of an audio frequency, means for combining said input signal and the output of said frequency-controlled oscillator to derive beat frequency signals of frequency varying over a given band, amplifier means responsive to a portion of said beat frequency band lying within an audio frequency range, scan disabling means responsive to output energy from said amplifier means for disabling said frequency scanning means, a low-pass filter supplied with energy from said amplifier means and having an audio frequency pass band smaller than that of said amplifier means, means including a phase comparator receptive of energy from said filter and from said reference frequency generator for deriving an error voltage during the presence of a coherent input signal, means for supplying said error voltage to said frequency-controlled oscillator frequency for locking said frequency-controlled oscillator to a frequency differing from that of said input signal by the frequency of said reference frequency generator.

2. A receiver of input signals comprising a frequency-controlled oscillator, frequency scanning means for varying the frequency of said oscillator within a prescribed range when in the frequency scanning condition, a fixed reference frequency generator productive of an audio frequency, means for combining said input signal and the output of said frequency-controlled oscillator to derive beat frequency signals of frequency varying over a given band, amplifier means responsive to a portion of said beat frequency band lying within an audio-frequency range, scan disabling means responsive to output energy from said amplifier means for disabling said frequency scanning means, a low-pass filter supplied with energy from said amplifier means, means including a phase comparator receptive of energy from said filter and from said reference frequency generator for deriving an error voltage during the presence of a coherent input signal, means for supplying said error voltage to said frequency-controlled oscillator frequency for locking said frequency-controlled oscillator to a frequency differing from that of said input signal by the frequency of said reference frequency generator.

3. A receiver of input signals comprising a frequency-controlled oscillator, frequency scanning means for varying the frequency of said oscillator within a prescribed range when in the frequency scanning condition, a fixed reference frequency generator productive of an audio frequency, means for combining said input signal and the output of said frequency-controlled oscillator to derive beat frequency signals of frequency varying over a given band, amplifier means responsive to a portion of said beat frequency band lying within an audio frequency range, scan disabling means responsive to output energy from said amplifier means for disabling said frequency scanning means, a low-pass filter supplied with energy from said amplifier means and having an audio frequency passband smaller than that of said amplifier means, recycle means operated by said disabling means for restoring said scanning means to the frequency-scanning condition in the absence of an input signal at a predetermined time interval after being disabled.

4. A receiver of input signals comprising a frequency-controlled oscillator, frequency scanning means for varying the frequency of said oscillator within a prescribed range when in the frequency scanning condition, a fixed reference frequency generator productive of an audio frequency, means for combining said input signal and the output of said frequency-controlled oscillator to derive beat frequency signals of frequency varying over a given band, amplifier means responsive to a portion of said beat frequency band lying within an audio frequency range, scan disabling means responsive to output energy from said amplifier means for disabling said frequency scanning means, a low-pass filter supplied with energy from said amplifier means and having an audio frequency passband smaller than that of said amplifier means, a recycle means including a low-pass filter network, means including a phase comparator and said low-pass filter network receptive of energy from said low-pass filter and from said reference frequency generator for deriving a holding voltage only during the presence of a coherent input signal, said recycle means being operated by said disabling means during absence of a holding voltage for restoring said scanning means to the frequency scanning condition at a predetermined time interval after being disabled, said recycle means further being restrained from enabling said scanning means in response to said holding voltage.

5. A receiver of input signals comprising a frequency-controlled oscillator, frequency scanning means for varying the frequency of said oscillator within a prescribed range when in the frequency scanning condition, a fixed reference frequency generator productive of an audio frequency, means for combining said input signal and the output of said frequency-controlled oscillator to derive beat frequency signals of frequency varying over a given band, amplifier means responsive to a portion of said beat frequency band lying within an audio frequency range, scan disabling means responsive to output energy from said amplifier means for disabling said frequency scanning means, a low-pass filter supplied with energy from said amplifier means and having an audio frequency passband smaller than that of said amplifier means, a first phase comparator receptive of energy from said filter and from said reference frequency generator for deriving an error voltage, said oscillator being locked to a frequency differing from that of said input signal by the frequency of said reference frequency generator in response to said error voltage, a recycle means including a low-pass filter network, means including a second phase comparator and said filter network receptive of energy from said filter and from said reference frequency generator for deriving a holding voltage only during the presence of a coherent input signal, said recycle means being operated by said disabling means during absence of a holding voltage for restoring said scanning means to the frequency scanning condition at a predetermined time interval after being disabled, said recycle means further being restrained from enabling said scanning means in response to said holding voltage.

6. In combination, a frequency-controllable oscillator, frequency scanning means capable of repetitively varying the frequency of said oscillator over a prescribed frequency range when in the frequency scanning condition, circuit means responsive to energy from said oscillator and energy from an input signal for obtaining a beat frequency signal, amplifier means in the output of said circuit means for passing a prescribed audio frequency band, means receptive of energy from said amplifier means for interrupting said frequency scanning means when said beat frequency is within the bandpass of said amplifier means, a filter connected in the output circuit of said amplifier means and having a pass-band smaller than that of said amplifier means, a fixed frequency generator for deriving an audio reference frequency, and means including a first phase comparator responsive to energy from said generator and from said filter for locking said oscillator on said incoming signal during the period when said scanning means is interrupted, a second phase comparator responsive to energy derived from said filter and from said reference frequency generator for producing a control voltage, and means receptive of said control voltage for maintaining the frequency scanning means interrupted during the time that said oscillator is locked on said incoming signal.

7. In combination, a frequency-controllable oscillator, frequency scanning means capable of repetitively varying the frequency of said oscillator over a prescribed frequency range when in the frequency scanning condition, circuit means responsive to energy from said oscillator and energy from an input signal for obtaining a beat frequency signal, amplifier means in the output of said circuit means for passing a prescribed audio frequency band, means receptive of energy from said amplifier means for interrupting said frequency scanning means when said beat frequency is within the passband of said amplifier means, means including a first phase comparator for locking said frequency-controllable oscillator on said incoming signal during the period when said scanning means is interrupted, a filter connected in the output circuit of said amplifier means and having a frequency passband smaller than that of said amplifier means, a fixed frequency generator for deriving an audio reference frequency of predetermined precision, means including a second phase comparator energized only during the presence of a coherent input signal for maintaining said frequency scanning means interrupted.

8. In combination, a frequency-controllable oscillator, frequency scanning means capable of repetitively varying the frequency of said oscillator over a prescribed frequency range when in the frequency scanning condition, circuit means responsive to energy from said oscillator and energy from an input signal for obtaining a beat frequency signal, amplifier means in the output of said circuit means for passing an audio frequency band, a filter connected in the output circuit of said amplifier means and having a passband of smaller frequency range than that of said amplifier means, a fixed reference frequency generator for deriving an audio reference frequency of predetermined precision, means including a first phase comparator energized during the presence of an input signal by energy from said reference frequency generator for deriving an error signal, means responsive to said error signal for maintaining the frequency of said beat frequency signal substantially equal to that of said reference frequency generator, said amplifier means being capable of passing a band of audio frequencies greater than the frequency of said beat frequency signal, means receptive of energy from said amplifier means for interrupting the frequency scanning means when said beat frequency signal lies within the passband of said amplifier means, means including a second phase detector responsive to the output from said filter and said reference frequency generator for deriving a control voltage during the occurrence of a coherent input signal, and means receptive of said control voltage for maintaining the frequency scanning means interrupted during the presence of an input signal.

9. In combination, a frequency-controllable oscillator, frequency scanning means capable of repetitively varying the frequency of said oscillator over a prescribed frequency range when in the frequency scanning condition, circuit means responsive to energy from said oscillator and energy from an input signal for obtaining a beat frequency signal, amplifier means in the output of said circuit means for passing an audio frequency band, a filter connected in the output circuit of said amplifier means and having a passband of smaller frequency range than that of said amplifier means, a fixed reference frequency generator for deriving an audio reference frequency of predetermined precision, means including a first phase comparator energized during the presence of an input signal by energy from said reference frequency generator for deriving an error signal, means responsive to said error signal for maintaining the frequency of said beat frequency signal substantially equal to that of said reference frequency generator, said amplifier means being capable of passing a band of audio frequencies greater than the frequency of said beat frequency signal, means receptive of energy from said amplifier means for interrupting the frequency scanning means when said beat frequency signal lies within the passband of said amplifier means, means for restoring said scanning means to the frequency scanning condition in the absence of an input signal at a predetermined time interval after being interrupted, a second phase detector responsive to the output from said filter and said reference frequency generator for deriving a control voltage, and means receptive of said control voltage for maintaining said frequency scanning means interrupted.

References Cited in the file of this patent

UNITED STATES PATENTS

| | | |
|---|---|---|
| 2,541,454 | White | Feb. 13, 1951 |
| 2,688,743 | Berger et al. | Sept. 7, 1954 |
| 2,702,852 | Briggs | Feb. 22, 1955 |
| 2,776,426 | Altman | Jan. 1, 1957 |
| 2,823,313 | Robins | Feb. 11, 1958 |
| 2,852,669 | Ashby | Sept. 16, 1958 |
| 2,871,468 | Smith | Jan. 27, 1959 |